(12) United States Patent
Takeshima et al.

(10) Patent No.: US 12,210,074 B2
(45) Date of Patent: Jan. 28, 2025

(54) MAGNETIC SENSOR AND METHOD FOR MANUFACTURING SAME

(71) Applicant: Mitsubishi Electric Corporation, Tokyo (JP)

(72) Inventors: Kaito Takeshima, Tokyo (JP); Shuichi Ueno, Tokyo (JP); Hideki Shimauchi, Tokyo (JP); Shinichi Hosomi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 279 days.

(21) Appl. No.: 17/920,049

(22) PCT Filed: Jun. 2, 2020

(86) PCT No.: PCT/JP2020/021751
§ 371 (c)(1),
(2) Date: Oct. 20, 2022

(87) PCT Pub. No.: WO2021/245785
PCT Pub. Date: Dec. 9, 2021

(65) Prior Publication Data
US 2023/0176150 A1    Jun. 8, 2023

(51) Int. Cl.
*G01R 33/09* (2006.01)
(52) U.S. Cl.
CPC ................. *G01R 33/093* (2013.01)
(58) Field of Classification Search
CPC .................................... G01R 33/093
See application file for complete search history.

(56) References Cited

U.S. PATENT DOCUMENTS

| | | | |
|---|---|---|---|
| 6,946,834 B2* | 9/2005 | Van Zon | G01R 33/09 324/252 |
| 7,589,939 B2* | 9/2009 | Wakui | G01R 33/093 324/252 |

(Continued)

FOREIGN PATENT DOCUMENTS

| | | |
|---|---|---|
| JP | 2002-328140 A | 11/2002 |
| JP | 2006-32710 A | 2/2006 |

(Continued)

OTHER PUBLICATIONS

International Search Report and Written Opinion mailed on Sep. 1, 2020, received for PCT Application PCT/JP2020/021751, filed on Jun. 2, 2020, 9 pages including English Translation.

(Continued)

*Primary Examiner* — Walter L Lindsay, Jr.
*Assistant Examiner* — Milton Gonzalez
(74) *Attorney, Agent, or Firm* — XSENSUS LLP

(57) ABSTRACT

A magnetic sensor capable of preventing degradation of magnetic measurement accuracy is obtained. The magnetic sensor includes a first sensor portion, a second sensor portion, and a connection portion. The first sensor portion extends in a first direction. The second sensor portion is disposed at an interval from the first sensor portion in a second direction orthogonal to the first direction. The first sensor portion includes a first end and a second end that are ends in the first direction. The second sensor portion includes a third end and a fourth end that are ends in the first direction. The connection portion connects the second end and the third end. The first sensor portion, the second sensor portion, and the connection portion are constituted of a multilayer body of a magnetic sensor element and a magnet. The magnet applies a bias magnetic field to the magnetic sensor element.

7 Claims, 10 Drawing Sheets

(56) References Cited

U.S. PATENT DOCUMENTS

2007/0018641 A1   1/2007   Hayashi et al.
2013/0127457 A1   5/2013   Musha et al.

FOREIGN PATENT DOCUMENTS

| JP | 2008-197002 A | 8/2008 |
| JP | 2012-15428 A | 1/2012 |
| WO | 2005/024861 A1 | 3/2005 |
| WO | 2009/151023 A1 | 12/2009 |
| WO | 2012/014546 A1 | 2/2012 |

OTHER PUBLICATIONS

Notice of Reasons for Refusal mailed on Feb. 2, 2021, received for JP Application 2020-567273, 6 pages Including English Translation.
Decision of Refusal mailed on Jun. 29, 2021, received for JP Application 2020-567273, 7 pages including English Translation.

\* cited by examiner

MAGNETIC SENSOR AND METHOD FOR MANUFACTURING SAME

CROSS-REFERENCE TO RELATED APPLICATION

The present application is based on PCT filing PCT/JP2020/021751, filed Jun. 2, 2020, the entire contents of which is incorporated herein by reference.

TECHNICAL FIELD

The present disclosure relates to a magnetic sensor and a method for manufacturing the same.

BACKGROUND ART

Conventionally, a magnetic sensor including a magnetic sensor element such as a magnetoresistive element or a Hall element and a magnet applying a bias magnetic field to the magnetic sensor element is known (for example, see WO 2005/024861). In a conventional magnetic sensor, the magnetic sensor element and the magnet are disposed in a laminated state.

CITATION LIST

Patent Literature

PTL 1: WO 2005/024861

SUMMARY OF INVENTION

Technical Problem

In the conventional magnetic sensor described above, strength of the bias magnetic field applied to the magnetic sensor element is different between an end and a center of the magnet, so that sometimes measurement accuracy of magnetism is degraded.

The present disclosure has been made to solve the above problems, and an object of the present disclosure is to provide a magnetic sensor capable of preventing the degradation of the measurement accuracy of the magnetism.

Solution to Problem

A magnetic sensor according to the present disclosure includes a first sensor portion, a second sensor portion, and a connection portion. The first sensor portion extends in a first direction. The second sensor portion is disposed at an interval from the first sensor portion in a second direction orthogonal to the first direction. The second sensor portion is formed so as to extend along the first direction. The first sensor portion includes a first end and a second end that are ends in the first direction. The second sensor portion includes a third end and a fourth end that are ends in the first direction. The second end faces the third end. The connecting portion connects the second end and the third end. The first sensor portion, the second sensor portion, and the connection portion are constituted of a multilayer body of a magnetic sensor element and a magnet. The magnet applies a bias magnetic field to the magnetic sensor element.

A method for manufacturing a magnetic sensor according to the present disclosure includes: forming a multilayer body of a magnetic sensor element and a magnet on a main surface of a substrate having the main surface; and removing partially the multilayer body. The multilayer body processed by the removing partially the multilayer body includes a first sensor portion, a second sensor portion, and a connection portion. The first sensor portion extends in a first direction. The second sensor portion is disposed at an interval from the first sensor portion in a second direction orthogonal to the first direction. The second sensor portion is formed so as to extend along the first direction. The first sensor portion includes a first end and a second end that are ends in the first direction. The second sensor portion includes a third end and a fourth end that are ends in the first direction. The second end faces the third end. The connection portion connects the second end and the third end.

Advantageous Effects of Invention

According to the above, the magnetic sensor capable of preventing the degradation of the measurement accuracy of the magnetism is obtained.

DESCRIPTION OF EMBODIMENTS

Figure 1:
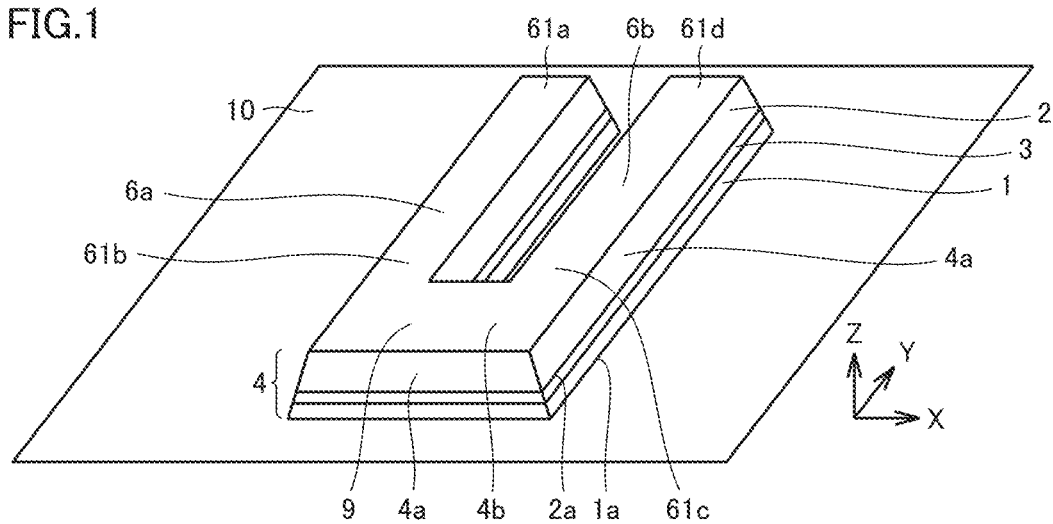
FIG. 1 is a schematic perspective view illustrating a magnetic sensor according to a first embodiment.

With reference to the drawings, an embodiment of the present invention will be described below. In the following drawings, the same or corresponding component is designated by the same reference numeral, and the overlapping description will be omitted.

First Embodiment

Configuration of Magnetic Sensor

Figure 2:
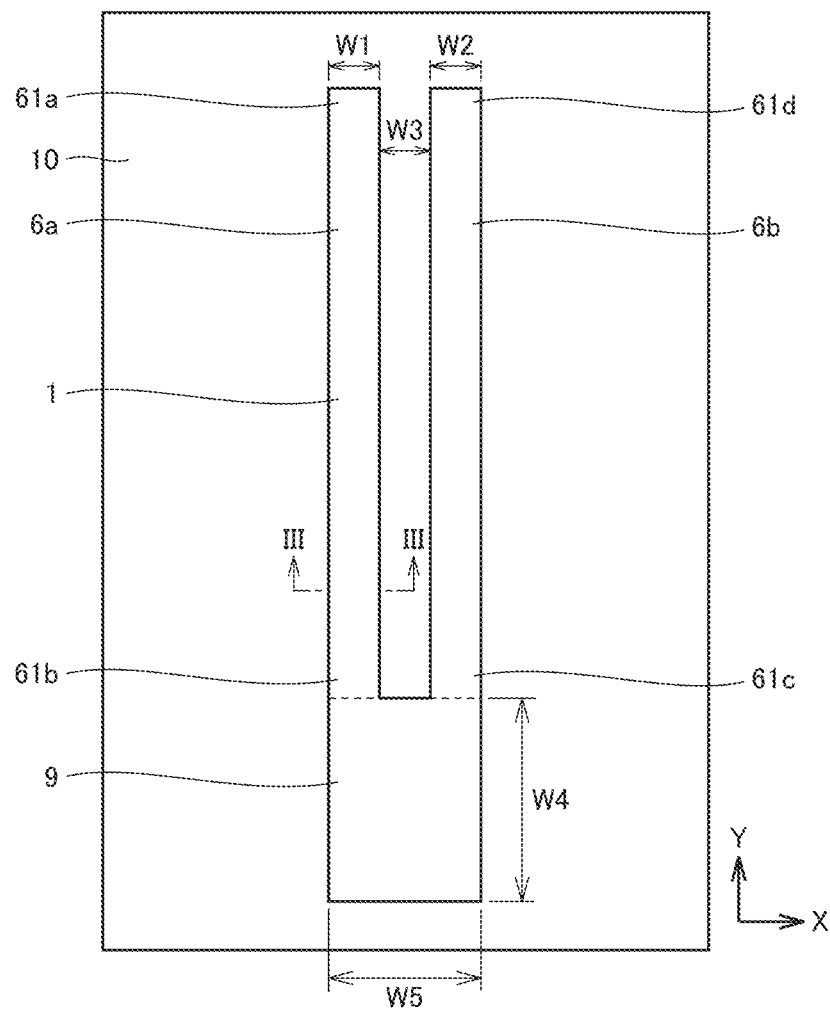
FIG. 2 is a schematic view illustrating a planar shape of the magnetic sensor in FIG. 1.
Figure 3:
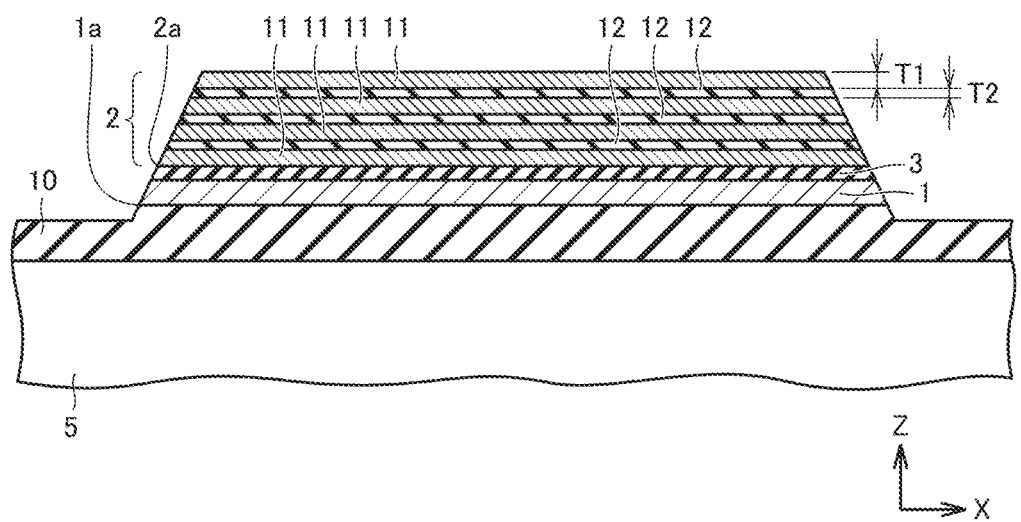
FIG. 3 is a schematic sectional view taken along a line III-III in FIG. 2.

FIG. 1 is a schematic perspective view illustrating a magnetic sensor according to a first embodiment. FIG. 2 is a schematic view illustrating a planar shape of the magnetic sensor in FIG. 1. FIG. 3 is a schematic sectional view taken along a line III-III in FIG. 2. FIG. 2 illustrates the planar shape of a lower surface (surface on a side of a substrate 5 or a surface along an XY-plane) of magnetic sensor element 1 constituting the magnetic sensor in order to describe the planar shape of the magnetic sensor.

The magnetic sensor in FIGS. 1 to 3 includes a first sensor portion 6a, a second sensor portion 6b, and a connection portion 9. First sensor portion 6a extends in a first direction (Y-axis direction). Second sensor portion 6b is disposed at an interval from first sensor portion 6a in a second direction (X-axis direction) orthogonal to the first direction. Second sensor portion 6b is formed so as to extend along the first direction (Y-axis direction). First sensor portion 6a and second sensor portion 6b are formed so as to extend along the same direction. First sensor portion 6a and second sensor portion 6b are formed so as to extend in parallel with each other. First sensor portion 6a and second sensor portion 6b have a rectangular planar shape.

First sensor portion 6a includes a first end 61a and a second end 61b that are ends in the first direction. Second sensor portion 6b includes a third end 61c and a fourth end 61d that are ends in the first direction. Second end 61b faces third end 61c. Connection portion 9 connects second end 61b and third end 61c.

First sensor portion 6a, second sensor portion 6b, and connection portion 9 are constituted of a multilayer body 4 of magnetic sensor element 1, a magnet 2, and an insulating film 3. Multilayer body 4 is formed on the main surface of substrate 5. More specifically, multilayer body 4 is formed on an insulating film 10 formed on the main surface of substrate 5. That is, insulating film 10 is formed so as to cover the main surface of substrate 5. Magnetic sensor element 1 is disposed on insulating film 10. Insulating film 3 is disposed on magnetic sensor element 1. Magnet 2 is disposed on insulating film 3. Magnet 2 applies a bias magnetic field to magnetic sensor element 1. In multilayer body 4, planar shapes of magnetic sensor element 1, insulating film 3, and magnet 2 are similar to each other.

In the magnetic sensor, multilayer body 4 includes a top surface 4b and a side surface 4a continuous with top surface 4b. Side surface 4a is inclined with respect to top surface 4b. Specifically, the planar shape of magnetic sensor element 1 is larger than the planar shape of magnet 2. In first sensor portion 6a and second sensor portion 6b, magnetic sensor element 1 is wider than magnet 2 in the second direction. In addition, magnetic sensor element 1 is wider than insulating film 3 in the second direction. From a different point of view, an outer edge 1a of magnetic sensor element 1 constituting multilayer body 4 is located outside an outer edge 2a of magnet 2 in planar view. Even in connection portion 9, magnetic sensor element 1 is wider than magnet 2 in the second direction. In addition, magnetic sensor element 1 is wider than insulating film 3 in the second direction.

In the first embodiment, the case where an artificial lattice giant magneto-resistance (GMR) element is used as magnetic sensor element 1 will be described as a most characteristic application example. The artificial lattice GMR element detects the magnetic field intensity, so that an S-pole and an N-pole cannot be determined. For this reason, a characteristic is shifted in magnetic sensor element 1 by applying the bias magnetic field using magnet 2 such as a thin film magnet to the artificial lattice GMR element as magnetic sensor element 1. As a result, the magnetic sensor can sense the magnetic field extending from the S-pole to the N-pole. Details of the shift of such the characteristic will be described later.

A Hall element, an anisotropic magnetoresistive effect element, a giant magnetoresistive effect element, a tunnel magnetoresistive effect element, and a sensor element that responds to other magnetic fields can be used as magnetic sensor element 1 in addition to the artificial lattice GMR element. As illustrated in FIGS. 1 to 3, preferably magnetic sensor element 1 has the configuration in which magnetic sensor element 1 can be planarly mounted on the main surface of substrate 5.

Dimensional design of magnetic sensor element 1 is prioritized in design of the magnetic sensor. In magnetic sensor element 1 of FIG. 2, for example, a width W1 of a short side of magnetic sensor element 1 constituting first sensor portion 6a is 10 µm. For example, a width W2 of the short side of magnetic sensor element 1 constituting second sensor portion 6b is 10 µm. Width W1 and width W2 may have the same value or different values. For example, a distance W3 between magnetic sensor element 1 constituting first sensor portion 6a and magnetic sensor element 1 constituting second sensor portion 6b is 10 µm. Width W1, width W2, and distance W3 may have the same value or different values.

For example, a width W4 in the Y-axis direction of magnetic sensor element 1 constituting connection portion 9 is 50 µm, and a width W5 in the X-axis direction is 30 µm. The planar shape of magnetic sensor element 1 constituting connection portion 9 is a quadrangular shape.

The shape of magnetic sensor element 1 is designed such that a resistance value of magnetic sensor element 1 becomes an appropriate value. For example, when the artificial lattice GMR element is used as magnetic sensor element 1, the planar shape of a portion constituting first sensor portion 6a and second sensor portion 6b, which are a magnetic sensitive portion of magnetic sensor element 1, is generally an elongated rectangular shape. This is because with such a shape, orientations of magnetic domains in the artificial lattice GMR elements constituting first sensor portion 6a and second sensor portion 6b are aligned based on shape magnetic anisotropy of the artificial lattice GMR element. Responses to the magnetic field in the short-side direction (X-axis direction) in the artificial lattice GMR elements constituting first sensor portion 6a and second sensor portion 6b become uniform by aligning the orientations of the magnetic domains in this manner.

The planar shapes of first sensor portion 6a and second sensor portion 6b are not limited to the rectangular shape, but may be another shape. For example, the planar shapes of first sensor portion 6a and second sensor portion 6b may be elliptical or the like. In addition, the planar shape of first sensor portion 6a and the planar shape of second sensor portion 6b may be different from each other.

In addition, when the artificial lattice GMR element is used as magnetic sensor element 1, the magnetic characteristic of magnetic sensor element 1 in connection portion 9 may be different from the magnetic characteristics of magnetic sensor element 1 in first sensor portion 6a and second sensor portion 6b due to the shape magnetic anisotropy. An output signal level of the magnetic sensor decreases due to a noise caused by such the difference in the magnetic characteristic. Accordingly, the resistance of magnetic sensor element 1 in the region (connection portion 9) other than first sensor portion 6a and second sensor portion 6b that are magnetic sensitive portions is required to be small. For this reason, in the shape of connection portion 9 through which the current flows in the X-axis direction, width W5 in the Y-axis direction is preferably larger than width W5 in the X-axis direction.

For example, a silicon substrate can be used as substrate 5. Substrate 5 may be made of any material. For example, another semiconductor material, an insulator, or the like may be used as the material of substrate 5. Insulating film 10 is formed on the main surface of substrate 5. For example, insulating film 10 may be a silicon oxide film obtained by thermally oxidizing the main surface of the silicon substrate that is substrate 5. Alternatively, insulating film 10 may be formed using a film forming method such as a sputtering method.

The artificial lattice GMR element as magnetic sensor element 1 is formed on insulating film 10 using, for example, the sputtering method or the like. The artificial lattice GMR element has a structure in which a magnetic layer as a conductor and a nonmagnetic layer are alternately laminated. At this time, for example, artificial lattice GMR element 1 is designed so as to sense the magnetic field in the X-axis direction based on a magnetic field response characteristic caused by the shape magnetic anisotropy. The magnetic field in a positive direction of the X-axis is positive, and the magnetic field in a negative direction of the X-axis is negative. Further, insulating film 3 is formed on magnetic sensor element 1 in order to electrically insulate magnetic sensor element 1 that is the artificial lattice GMR element from magnet 2 that is a thin film magnet. A silicon nitride film or a silicon oxide film is formed on insulating film 3 by, for example, the sputtering method or a CVD method.

As illustrated in FIG. 3, magnet 2 is formed by alternately laminating a magnetic film 11 and a nonmagnetic film 12. For example, cobalt platinum (CoPt) or the like can be used as magnetic film 11. A silicon oxide film (SiO), a chromium (Cr) film, or the like can be used as nonmagnetic film 12. For example, a thickness T1 of magnetic film 11 made of a ferromagnetic material is 30 nm. For example, a thickness T2 of nonmagnetic film 12 is 10 nm. Magnetic film 11 and nonmagnetic film 12 can be formed by any method such as the sputtering method. After a laminated structure including magnetic film 11 that becomes magnet 2 and nonmagnetic film 12 is formed, for example, the laminated structure is exposed in a high magnetic field having magnetic flux density of 2 T. In this way, magnetization processing of aligning a magnetization direction of magnet 2 is performed. In the first embodiment, magnet 2 is magnetized such that the right side in FIG. 3 is the S-pole while the left side is the N-pole. At this point, by exposing the laminated structure in a magnetic field in a reverse direction, magnet 2 may be magnetized such that the left side in FIG. 3 becomes the N-pole while the right side becomes the S-pole. Because a magnetic sensing direction of magnetic sensor element 1 is the X-axis direction, as a result, the magnetic sensing direction of magnetic sensor element 1 and the direction of the bias magnetic field applied to magnetic sensor element 1 by magnet 2 are aligned in the X-axis direction.

Method for Manufacturing Magnetic Sensor

FIGS. 4 to 11 are schematic sectional views illustrating the method for manufacturing the magnetic sensor in FIG. 1. FIGS. 4 to 11 correspond to a section of the magnetic sensor in FIG. 3.

In the method for manufacturing the magnetic sensor in FIG. 1, first a film forming process (S10) is performed. In this process (S10), as illustrated in FIGS. 4 to 7, multilayer body 4 (see FIG. 1) including magnetic sensor element 1 and magnet 2 is formed on the main surface of substrate 5 including the main surface.

Figure 4:
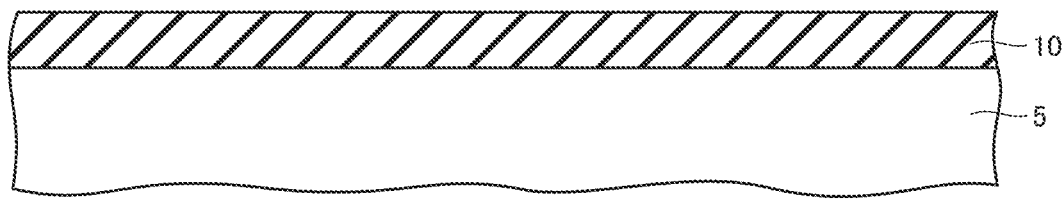
FIG. 4 is a schematic sectional view illustrating a method for manufacturing the magnetic sensor in FIG. 1.
Figure 5:
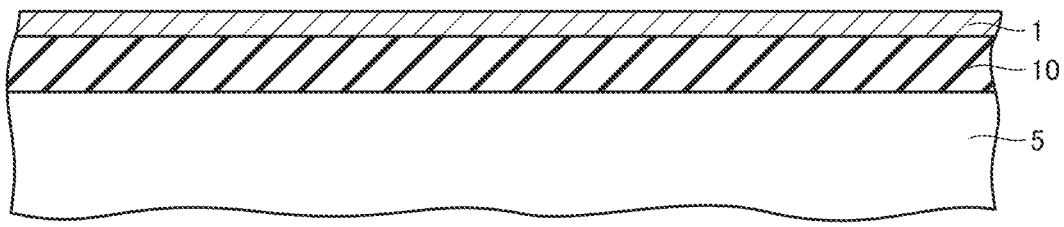
FIG. 5 is a schematic sectional view illustrating the method for manufacturing the magnetic sensor in FIG. 1.

Specifically, in this process (S10), substrate 5 is first prepared as illustrated in FIG. 4. Insulating film 10 is formed on the main surface of substrate 5. Subsequently, as illustrated in FIG. 5, magnetic sensor element 1 is formed on insulating film 10. For example, the artificial lattice GMR element is formed as magnetic sensor element 1. In this case, magnetic sensor element 1 is formed by laminating the magnetic film and the nonmagnetic film using the sputtering method.

Figure 6:
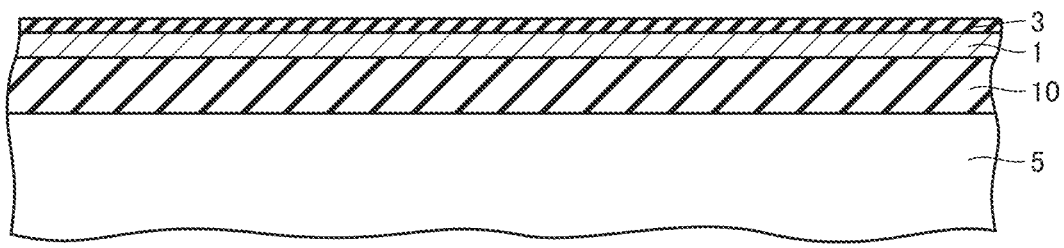
FIG. 6 is a schematic sectional view illustrating the method for manufacturing the magnetic sensor in FIG. 1.

Subsequently, as illustrated in FIG. 6, insulating film 3 is formed on magnetic sensor element 1. For example, a silicon oxide film or a silicon nitride film is formed as insulating film 3. Insulating film 3 is formed by using, for example, the sputtering method or the chemical vapor deposition (CVD) method.

Figure 7:
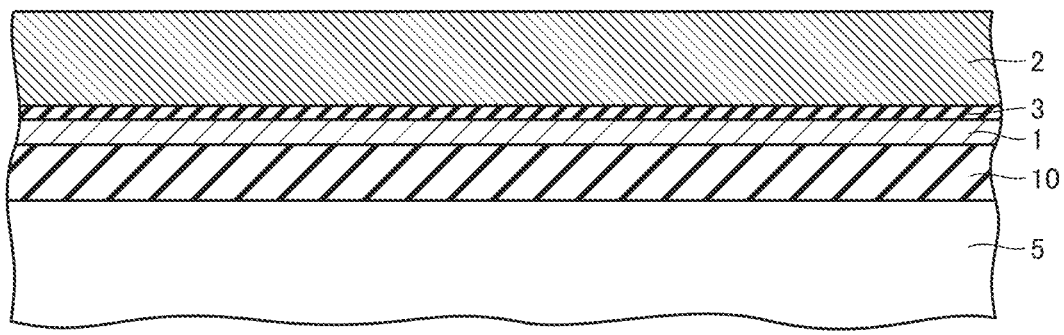
FIG. 7 is a schematic sectional view illustrating the method for manufacturing the magnetic sensor in FIG. 1.

Subsequently, as illustrated in FIG. 7, magnet 2 that is a thin film magnet is formed on insulating film 3. Magnet 2 can be formed by, for example, the sputtering method. A laminated structure in which magnetic film 11 and nonmagnetic film 12 are alternately formed as illustrated in FIG. 3 can be adopted as a configuration of magnet 2. In this way, multilayer body 4 (see FIG. 1) in which magnetic sensor element 1, insulating film 3, and magnet 2 are laminated is formed.

Figure 8:
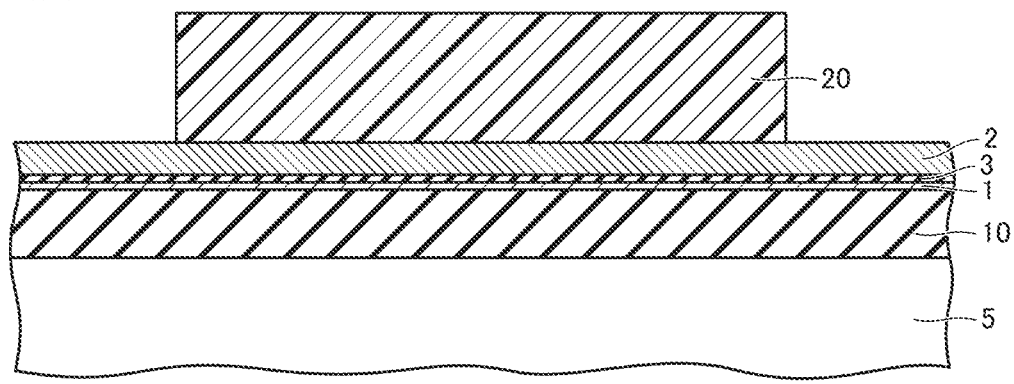
FIG. 8 is a schematic sectional view illustrating the method for manufacturing the magnetic sensor in FIG. 1.

Subsequently, a removing process (S20) is performed. In this process (S20), multilayer body 4 is partially removed. Specifically, as illustrated in FIG. 8, after the photoresist is applied onto magnet 2, a resist pattern 20 is formed by photoengraving.

Figure 9:
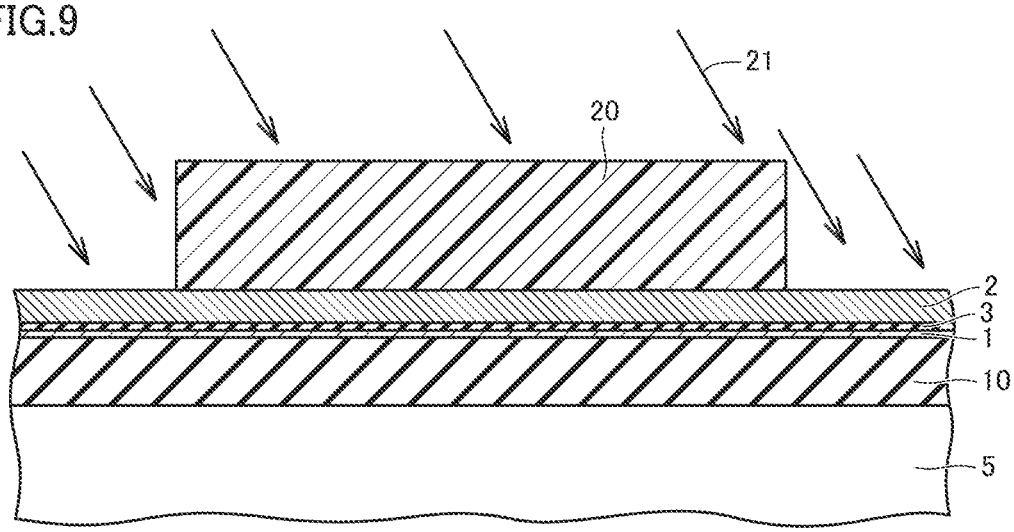
FIG. 9 is a schematic sectional view illustrating the method for manufacturing the magnetic sensor in FIG. 1.
Figure 10:
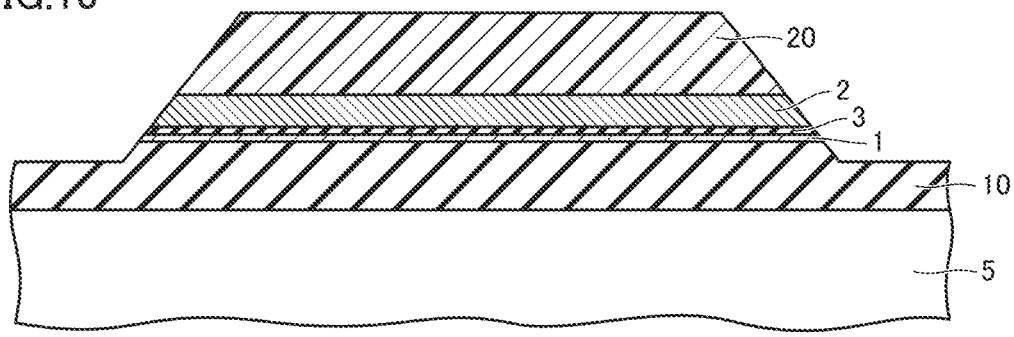
FIG. 10 is a schematic sectional view illustrating the method for manufacturing the magnetic sensor in FIG. 1.
Figure 11:
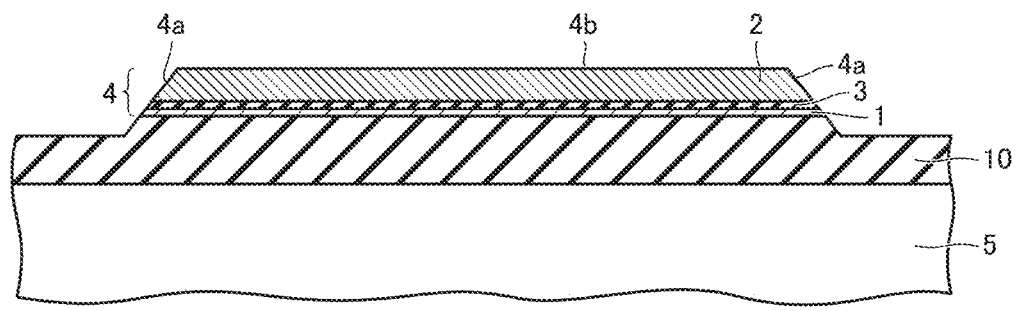
FIG. 11 is a schematic sectional view illustrating the method for manufacturing the magnetic sensor in FIG. 1.

Subsequently, a processing process (S20) is performed. In this process (S20), multilayer body 4 is partially removed. Specifically, as illustrated in FIG. 8, after the photoresist is applied onto magnet 2, a resist pattern 20 is formed by photoengraving. Subsequently, as illustrated in FIG. 9, magnet 2, insulating film 3, magnetic sensor element 1, and a part of insulating film 10 are continuously etched and removed using resist pattern 20 as the mask. In this process, for example, ion milling of irradiating the main surface of substrate 5 with ions from an oblique direction may be used as indicated by an arrow 21. By inclining the ion irradiation direction with respect to the main surface of substrate 5 in this manner, as illustrated in FIG. 10, the side wall of multilayer body 4 in which magnetic sensor element 1, insulating film 3, and magnet 2 are laminated can be inclined with respect to the main surface of substrate 5. Thereafter, multilayer body 4 in FIG. 11 can be obtained by removing resist pattern 20.

Multilayer body 4 may be partially removed using a mask (hard mask) made of an insulating film such as a silicon nitride film instead of resist pattern 20. For example, instead of the process in FIG. 8, an insulating film such as a silicon nitride film may be formed on magnet 2. A photoresist may be applied onto the insulating film, and a resist pattern may be formed by the photoengraving. The hard mask made of the insulating film may be formed by partially removing the insulating film using the resist pattern as the mask. Thereafter, the resist pattern may be removed. The hard mask may be used as the mask to remove a part of magnet 2, insulating film 3, magnetic sensor element 1, and insulating film 10 similarly to the processes in FIGS. 9 and 10. Thereafter, the hard mask is removed, whereby multilayer body 4 in FIG. 11 can be obtained.

Multilayer body 4 obtained in the above processes has a structure in FIG. 1.

In this way, the magnetic sensor according to the present disclosure can be easily obtained.

Operation of Magnetic Sensor

Figure 12:
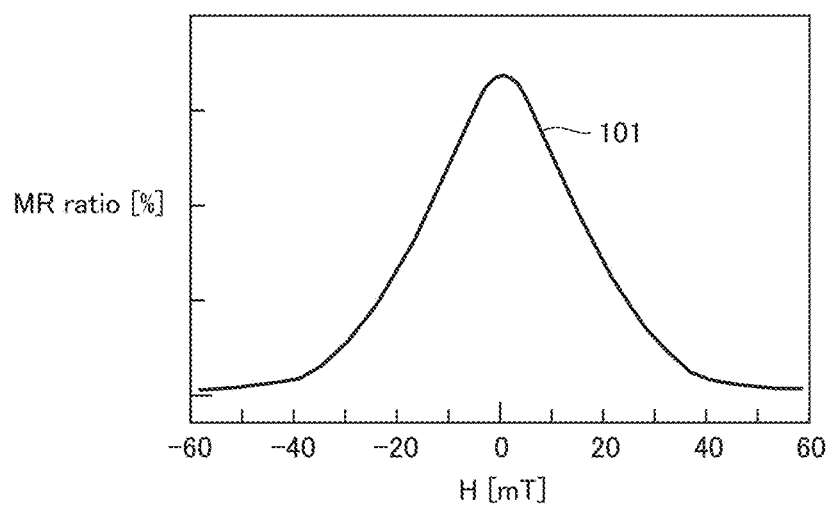
FIG. 12 is a graph illustrating a relationship between a magnetic field and a resistance characteristic of a general artificial lattice GMR element.
Figure 13:
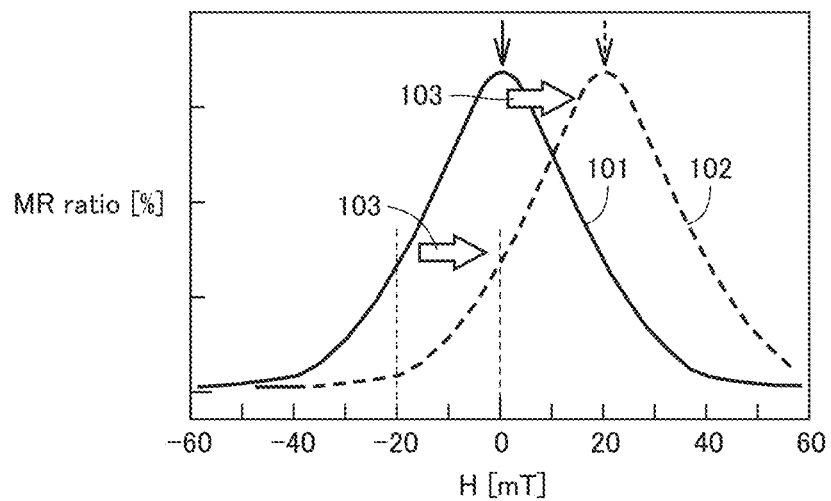
FIG. 13 is a graph illustrating the relationship between the magnetic field and the resistance characteristic when a bias magnetic field is applied to an artificial lattice GMR element.

FIG. 12 is a graph illustrating a relationship (magnetism-resistance characteristic) between the magnetic field and a resistance characteristic of a general artificial lattice GMR element. FIG. 13 is a graph illustrating the relationship between the magnetic field and the resistance characteristic when the bias magnetic field is applied to the artificial lattice GMR element. In each of the graphs of FIGS. 12 and 13, a vertical axis represents an MR ratio (unit: %) with respect to the magnetic field applied to the magnetic sensor. In addition, a horizontal axis of the graph in FIGS. 12 and 13 represents intensity H (unit: mT) represented by the magnetic flux density of the magnetic field applied from a certain direction to the magnetic sensor.

In FIG. 12, a solid line graph 101 indicates the MR ratio with respect to the magnetic field from one direction of the artificial lattice GMR element. As can be seen from FIG. 12, the solid line graph 101 illustrates positive and negative target characteristics based on 0 mT. For this reason, the output from the artificial lattice GMR element is the same in the case where the magnetic field having certain strength is applied in the first direction that is the magnetic sensing direction of the artificial lattice GMR element and in the case where the magnetic field having the same strength is applied in the direction opposite to the first direction. For this reason, the artificial lattice GMR element can detect the strength of the magnetic field, but cannot detect the direction of the magnetic field.

Accordingly, as illustrated in FIG. 13, the bias magnetic field different from the external magnetic field to be sensed is applied to the artificial lattice GMR element. For example, in the example of FIG. 13, the bias magnetic field having the intensity of 20 mT is applied in the magnetic sensing direction of the artificial lattice GMR element. As a result, as indicated by an arrow 103 in FIG. 13, the resistance characteristic of the artificial lattice GMR element with respect to the input magnetic field from the outside different from the bias magnetic field is shifted and becomes a broken line graph 102. By such the shift of the magneto-resistance characteristic, the output of the artificial lattice GMR element monotonically increases, for example, in the range where the magnetic flux density of the magnetic field is −20 mT to 20 mT. That is, the magnetic field can be determined for both the magnetic field in the first direction indicating the magnetic flux density from −20 mT to 0 mT and the magnetic field in the second direction that is opposite to the first direction and indicates the magnetic flux density from 0 mT to 20 mT. Accordingly, in the range of the magnetic flux density where an absolute value is up to 20 mT, the direction of the magnetic field can be detected together with the strength of the magnetic field.

In the magnetic sensor of FIGS. 1 to 3, the magnetic field generated by magnet 2 acts as the bias magnetic field for magnetic sensor element 1 including the artificial lattice GMR element or the like. For this reason, the magnetism-resistance characteristic of the magnetic sensor element 1 is shifted as illustrated in FIG. 13.

Figure 14:
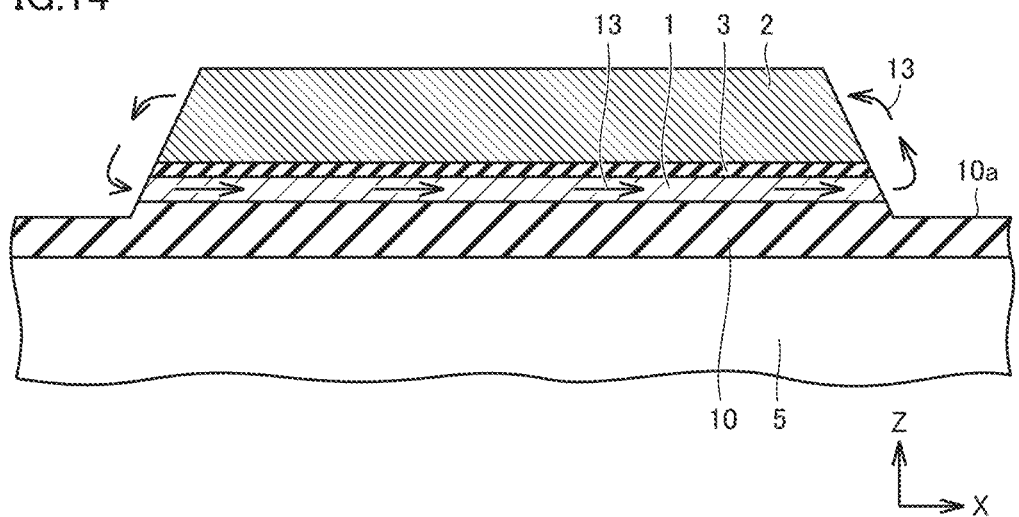
FIG. 14 is a schematic diagram illustrating a state in which a bias magnetic field generated by a magnet is applied to a magnetic sensor element in the magnetic sensor in FIG. 1.

FIG. 14 is a schematic diagram illustrating the state in which the magnetic field generated by magnet 2 is applied to magnetic sensor element 1 as the bias magnetic field in the magnetic sensor in FIG. 1. As illustrated in FIG. 14, the magnetic flux generated from magnet 2 forms a magnetic circuit as indicated by an arrow 13. That is, the magnetic circuit that passes through the inside of magnetic sensor element 1 in the X-axis direction from the first end of magnet 2 in the X-axis direction to reach the second end of magnet 2 on the opposite side of the first end is formed.

The magnetic field to be detected by the magnetic sensor is applied to magnetic sensor element 1 in the X-axis direction. At this time, the magnetic field obtained by combining the magnetic field to be detected and the bias magnetic field generated from magnet 2 is applied to magnetic sensor element 1. The resistance of magnetic sensor element 1 configured of, for example, the artificial lattice GMR element changes according to the combined magnetic field. For example, it is assumed that an electric circuit in which a certain resistance is disposed in series with magnetic sensor element 1. In this case, when a constant voltage is applied to both ends of the electric circuit, the voltage at an intermediate point between magnetic sensor element 1 and the resistor changes according to the intensity of the magnetic field applied to magnetic sensor element 1. When the voltage value at the intermediate point is extracted as an output signal, it acts as the magnetic sensor that detects the strength of the magnetic field. At this time, the magnetic field generated from magnet 2 acts as the bias magnetic field, and the strength and direction (positive and negative) of the magnetic field can be detected as described above.

Advantageous Effect

The magnetic sensor according to the present disclosure includes first sensor portion 6a, second sensor portion 6b, and connection portion 9. First sensor portion 6a extends in a first direction (Y-axis direction). Second sensor portion 6b is disposed at an interval from first sensor portion 6a in a second direction (X-axis direction) orthogonal to the first direction. Second sensor portion 6b is formed so as to extend along the first direction. First sensor portion 6a includes a first end 61a and a second end 61b that are ends in the first direction. Second sensor portion 6b includes a third end 61c and a fourth end 61d that are ends in the first direction. Second end 61b faces third end 61c. Connection portion 9 connects second end 61b and third end 61c. First sensor portion 6a, second sensor portion 6b, and connection portion 9 are constituted of multilayer body 4 of magnetic sensor element 1 and magnet 2. Magnet 2 applies a bias magnetic field to magnetic sensor element 1.

In this way, the bias magnetic field can also be applied from magnet 2 of connection portion 9 to second end 61b of first sensor portion 6a and third end 61c of second sensor portion 6b. Accordingly, the decrease in the magnetic flux density of the bias magnetic field at second end 61b of first sensor portion 6a and third end 61c of second sensor portion 6b can be prevented as compared with the case where connection portion 9 does not exist. Consequently, the decrease in the sensitivity of the magnetic sensor due to the decrease in the magnetic flux density of the bias magnetic field can be prevented. That is, the degradation of the measurement accuracy of the magnetic sensor can be prevented.

In the magnetic sensor, outer edge 1a of magnetic sensor element 1 is positioned outside outer edge 2a of magnet 2 in planar view. In this case, because most of the bias magnetic field by magnet 2 is applied to magnetic sensor element 1, the magnetic field intensity applied to magnetic sensor element 1 can be increased as compared with the case where outer edge 1a of magnetic sensor element 1 is located inside outer edge 2a of magnet 2.

In the magnetic sensor, multilayer body 4 includes a top surface 4b and a side surface 4a continuous with top surface 4b. Side surface 4a is inclined with respect to top surface 4b. In this case, the structure in which outer edge 1a of magnetic sensor element 1 is located outside outer edge 2a of magnet 2 can be easily implemented by inclining side surface 4a of multilayer body 4.

In the magnetic sensor, multilayer body 4 includes insulating film 3 disposed between magnetic sensor element 1 and magnet 2. In this case, multilayer body 4 can be formed by laminating magnet 2 and magnetic sensor element 1 without impairing the function of magnetic sensor element 1.

In the magnetic sensor, the magnetic sensing direction of magnetic sensor element 1 and the direction of the bias magnetic field applied to magnetic sensor element 1 by magnet 2 (the direction indicated by arrow 13) are along the second direction (X-axis direction). In this case, the characteristic of magnetic sensor element 1 can be reliably shifted by the bias magnetic field. As a result, the sensitivity of the magnetic sensor can be improved.

Figure 15:
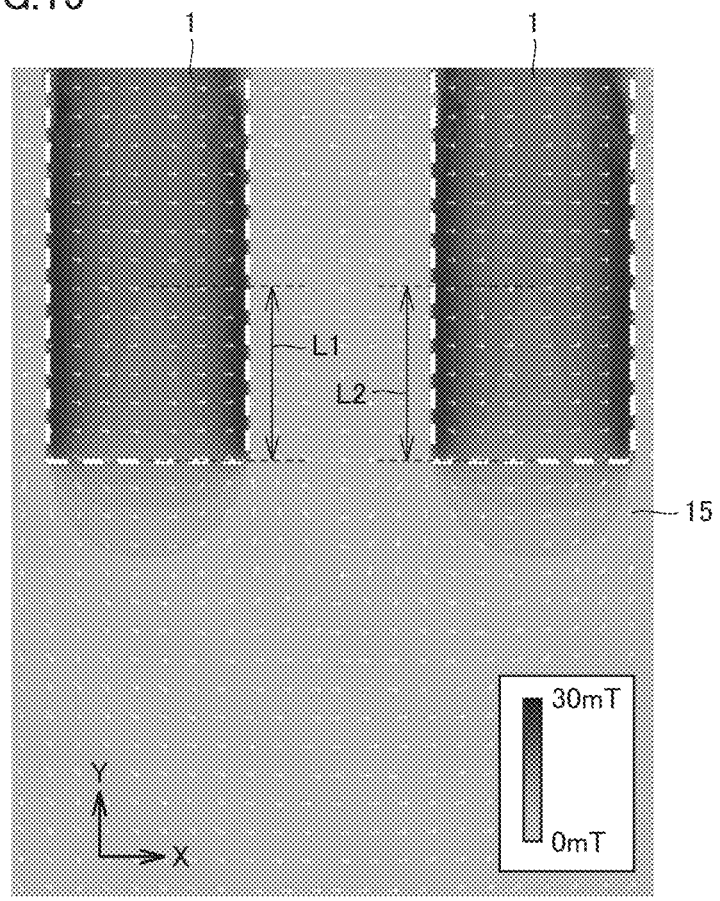
FIG. 15 is a schematic diagram illustrating a simulation result of a magnetic flux density distribution when the bias magnetic field generated by the magnet is applied to the magnetic sensor element in a magnetic sensor of a comparative example.
Figure 16:
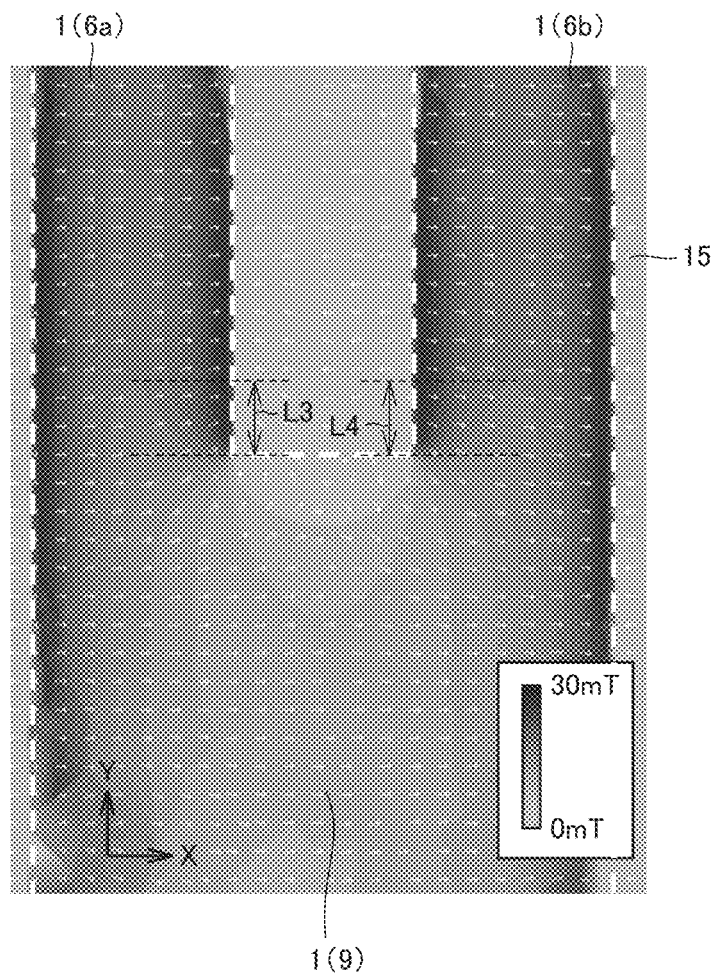
FIG. 16 is a schematic diagram illustrating the simulation result of the magnetic flux density distribution when the bias magnetic field generated by the magnet is applied to the magnetic sensor element in the magnetic sensor of the first embodiment.
Figure 17:
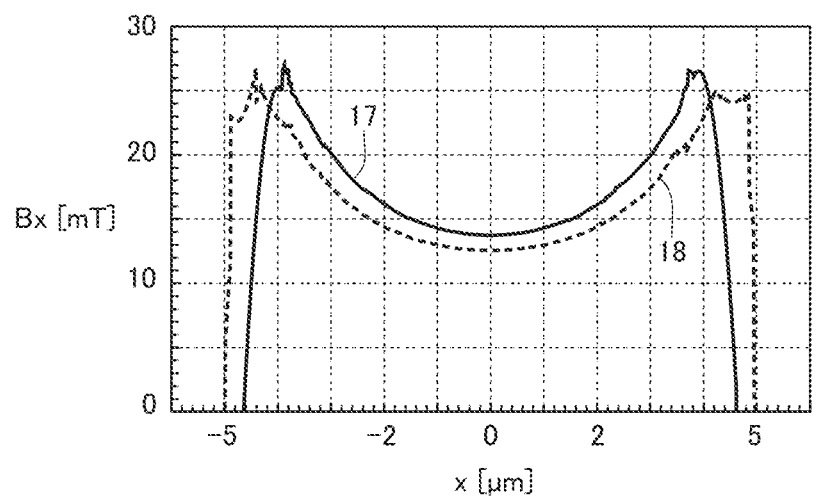
FIG. 17 is a graph illustrating the simulation result of the magnetic flux density distribution when a side surface of the magnetic sensor is inclined.

The effects of the above-described magnetic sensor will be described more detail below. FIG. 15 is a schematic diagram illustrating a simulation result of the magnetic flux density distribution when the bias magnetic field generated by the magnet is applied to the magnetic sensor element in the magnetic sensor of a comparative example. FIG. 16 is a schematic diagram illustrating the simulation result of the magnetic flux density distribution when the bias magnetic field generated by the magnet is applied to the magnetic sensor element in the magnetic sensor of the first embodiment. FIG. 17 is a graph illustrating the simulation result of the magnetic flux density distribution when the side surface of the magnetic sensor is inclined.

The magnetic sensor of the comparative example to be analyzed by the simulation in FIG. 15 basically has the same configuration as the magnetic sensor in FIG. 1, but has only a rectangular portion corresponding to first sensor portion 6a and second sensor portion 6b. That is, the connection portion connecting first sensor portion 6a and second sensor portion 6b is not formed in the magnetic sensor of the comparative example. FIG. 15 illustrates the simulation result of the magnetic flux density of the bias magnetic field supplied from magnet 2 to magnetic sensor element 1 in the magnetic sensor of the comparative example. The target surface of the simulation in FIG. 15 is an X-Y surface disposed at a position of −200 nm in the Z-axis direction from the bottom surface of magnet 2. The simulation conditions described above are also applied to the simulation in FIG. 16.

In FIG. 15, the magnetic flux density in the positive X-axis direction is indicated by shading. An arrow 15 in FIG. 15 indicates the direction of the magnetic flux at the measurement points set at intervals of 1.5 μm on the simulation target surface described above. As can be seen from FIG. 15, the magnetic flux density of the magnetic field penetrating a certain portion of magnetic sensor element 1 is determined based on interaction between a part of magnet 2 located immediately above the certain portion and another part of surrounding magnet 2 in the Y-axis direction as viewed from the part.

As illustrated in FIG. 15, the region where the magnetic flux density attenuates extends inside magnetic sensor element 1 from the end of rectangular magnetic sensor element 1. Widths L1, L2 of the region where the attenuation rate of the magnetic flux density is 10% are about 9 μm. Such the area is generated because the supply of the magnetic flux from the surroundings to the area is reduced. On the other hand, in magnetic sensor element 1, the magnetic flux density in the region where the attenuation of the magnetic flux density passing through magnetic sensor element 1 is not generated can be regarded as equivalent to the magnetic flux density in the case where the magnetic sensor extends infinitely in the Y-axis direction.

When the magnetic flux density supplied from magnet 2 to magnetic sensor element 1 attenuates, the shift amount of the magnetism-resistance characteristic of magnetic sensor element 1 decreases. In this case, in addition to the characteristic of the ideal shift amount in which the attenuation of the magnetic flux density is not generated, the characteristic in which the shift amount decreases due to the bias magnetic field is superimposed. For this reason, as the variation in the shift amount of the characteristic caused by the bias magnetic field is larger, as a result, the change in the output signal of the entire magnetic sensor becomes slower. Accordingly, the sensitivity of the magnetic sensor decreases.

On the other hand, as illustrated in FIG. 16, in the magnetic sensor of the first embodiment, it can be seen that the substantially constant bias magnetic field is applied in most regions of magnetic sensor element 1 in first sensor portion 6a and second sensor portion 6b that are magnetic sensitive portions. This is because magnetic sensor element 1 and magnet 2 are stacked in the same pattern to form multilayer body 4 (see FIG. 1). That is, magnet 2 is also formed in connection portion 9. The magnetic flux density of the bias magnetic field attenuates at the end in the Y-axis direction of magnetic sensor element 1 constituting multilayer body 4. However, as illustrated in FIG. 16, the region where the magnetic flux density of the bias magnetic field attenuates in magnetic sensor element 1 is the region included in connection portion 9.

Consequently, focusing on first sensor portion 6a and second sensor portion 6b, because the bias magnetic field from magnet 2 (see FIG. 1) located in connection portion 9 is supplied, in the first embodiment, widths L3, L4 of the region where the magnetic flux density attenuates by 10% from the ends of first sensor portion 6a and second sensor portion 6b can be prevented to, for example, about 4 μm.

Accordingly, in magnetic sensor element 1, the bias magnetic field applied to the portions located in first sensor portion 6a and second sensor portion 6b is more uniform as compared with the structure without magnet 2 located in connection portion 9. For this reason, the variation in the shift of the magnetism-resistance characteristic due to the bias magnetic field by magnet 2 is prevented in magnetic sensor element 1 in first sensor portion 6a and second sensor portion 6b. As a result, the characteristic of the magnetic sensor in which the characteristic is shifted while maintaining the original sensitivity of magnetic sensor element 1 becomes ideal. That is, the sensitivity of the magnetic sensor is improved as compared with the structure without connection portion 9 including magnet 2 in multilayer body 4. In the first embodiment, the side surface of multilayer body 4 has the inclined tapered shape, but this effect can also be obtained in multilayer body 4 having no tapered shape.

In the magnetic sensor of the first embodiment in FIGS. 1 to 3, side surface 4a of multilayer body 4 has the tapered structure inclined with respect to top surface 4b of multilayer body 4 or the main surface of substrate 5. For this reason, the area of magnet 2 is smaller than the area of magnetic sensor element 1. FIG. 17 illustrates the simulation result of the distribution of the magnetic flux density in the X-axis direction from magnet 2 supplied to the section in the X-axis direction of magnetic sensor element 1 in first sensor portion 6a at this time. In FIG. 17, the horizontal axis represents the position (unit: μm) in the X-axis direction (width direction) of first sensor portion 6a. The origin of the horizontal axis means the center in the width direction of first sensor portion 6a. In FIG. 17, the vertical axis represents the magnetic flux density (unit: mT).

In FIG. 17, the result in the case where side surface 4a of multilayer body 4 in FIG. 1 has the inclined tapered structure is illustrated as a solid line graph 17. In addition, as a comparative example, for the case of the structure in which the size of magnetic sensor element 1 is the same as that of the first embodiment and side surface 4a of multilayer body 4 is not inclined (that is, the width of magnetic sensor element 1 and the width of magnet 2 are the same), the result in which the distribution of the magnetic flux density is similarly simulated is indicated by a broken line graph 18. However, in the simulation, it is assumed that the bias magnetic field of +20 mT is applied.

As can be seen from FIG. 17, in the magnetic sensor of the first embodiment indicated by the solid line graph 17, the magnetic field intensity at the center in the X-axis direction of magnetic sensor element 1 increases as compared with the comparative example due to the decrease in the width of magnet 2. On the other hand, at both ends of magnetic sensor element 1, the magnetic field intensity is attenuated as compared with the comparative example.

However, when magnetic sensor element 1 such as the artificial lattice GMR element is processed by the ion milling or the like, it is known that the characteristic of magnetic sensor element 1 is degraded at the end of magnetic sensor element 1 processed by the ion milling or the like. Accordingly, the influence of the attenuation of the magnetic field intensity in the bias magnetic field at the end of magnetic sensor element 1 is limited. For this reason, by inclining side surface 4a of multilayer body 4 to decrease the width of magnet 2 smaller than the width of magnetic sensor element 1 as in the first embodiment, the intensity of the magnetic field applied to the center of magnetic sensor element 1 can be increased, and as a result, the thickness of the magnet (the number of laminated magnetic films 11 in FIG. 3) can be decreased. As a result, the manufacturing cost of the magnetic sensor can be reduced.

A method for manufacturing the magnetic sensor of the present disclosure includes: the process (S10) of forming multilayer body 4 of magnetic sensor element 1 and magnet 2 on the main surface of substrate 5 having the main surface; and the process (S20) of partially removing multilayer body 4. Multilayer body 4 processed in the removing process (S20) includes first sensor portion 6a, second sensor portion 6b, and connection portion 9. First sensor portion 6a extends in a first direction (Y-axis direction). Second sensor portion 6b is disposed at an interval from first sensor portion 6a in a second direction (X-axis direction) orthogonal to the first direction. Second sensor portion 6b is formed so as to extend along the first direction. First sensor portion 6a includes a first end 61a and a second end 61b that are ends in the first direction. Second sensor portion 6b includes a third end 61c and a fourth end 61d that are ends in the first direction. Second end 61b faces third end 61c. Connection portion 9 connects second end 61b and third end 61c.

In this way, the magnetic sensor according to the present disclosure can be easily obtained.

In the above method for manufacturing the magnetic sensor, in the removing process (S20), magnetic sensor element 1 and magnet 2 in multilayer body 4 are continuously etched.

In this case, the etching process for magnet 2 can be performed in the same process as the etching process for magnetic sensor element 1, so that the increase in the number of processes of the manufacturing process due to the addition of magnet 2 to the magnetic sensor can be prevented. In addition, when the shape of magnet 2 is made different from the shape of magnetic sensor element 1, another photoengraving process and another etching process are required for magnetic sensor element 1 and magnet 2. However, as described above, magnetic sensor element 1 can prevent the increase in the manufacturing cost of the magnetic sensor as a result. In addition, in the case where the etching of magnetic sensor element 1 and the etching of magnet 2 are performed in separate processes, there is a possibility that a problem such as misalignment between the disposition of magnetic sensor element 1 and the disposition of magnet 2 is generated. However, the generation of such the problem can be prevented by continuously etching magnetic sensor element 1 and magnet 2 as described above.

Modification

Figure 18:
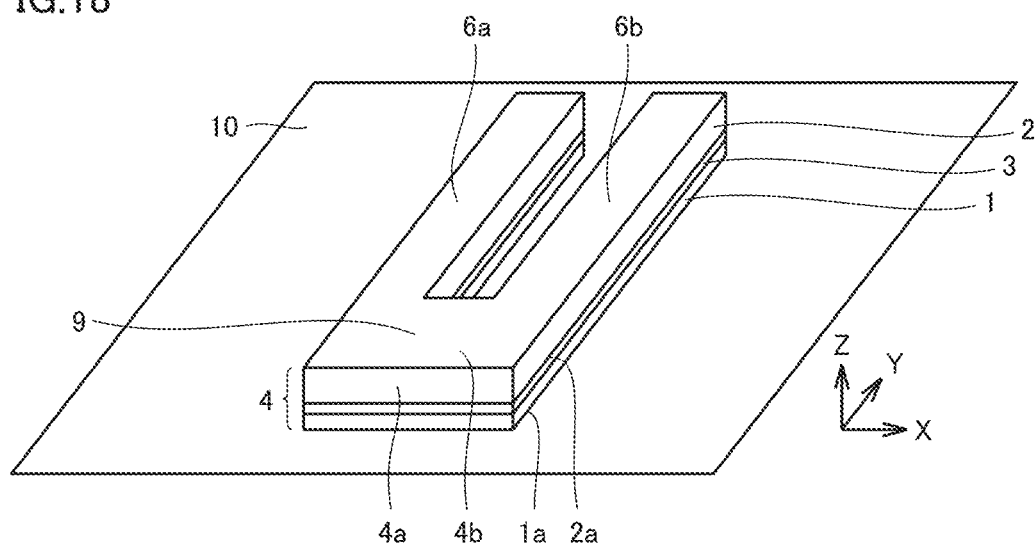
FIG. 18 is a schematic perspective view illustrating a modification of the magnetic sensor of the first embodiment.

FIG. 18 is a schematic perspective view illustrating a modification of the magnetic sensor of the first embodiment. The magnetic sensor in FIG. 18 basically has the same configuration as the magnetic sensor in FIGS. 1 to 3, and is different from the magnetic sensor in FIGS. 1 to 3 in that side surface 4a of multilayer body 4 is not inclined with respect to top surface 4b, namely, the planar shapes of magnet 2 and magnetic sensor element 1 are substantially the same. Also in the magnetic sensor having such the configuration, because magnet 2 is disposed in connection portion 9 connected to first sensor portion 6a and second sensor portion 6b, a variation in shift of the magnetoresistance characteristic due to the bias magnetic field by magnet 2 is prevented similarly to the magnetic sensor in FIGS. 1 to 3. As a result, the sensitivity of the magnetic sensor is improved as compared with the structure without connection portion 9 including magnet 2 in multilayer body 4.

Second Embodiment

Configuration of Magnetic Sensor

Figure 19:
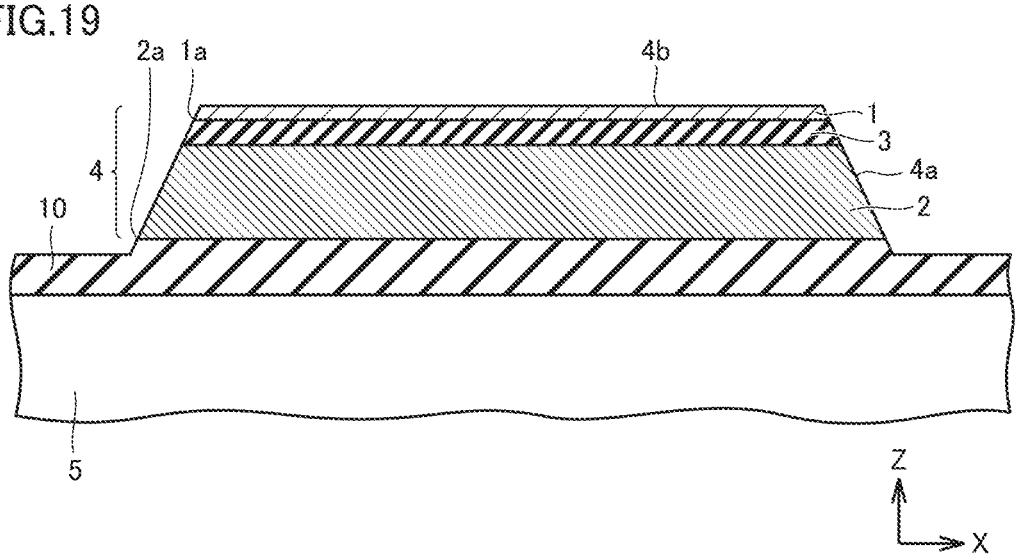
FIG. 19 is a schematic sectional view illustrating a magnetic sensor according to a second embodiment.

FIG. 19 is a schematic sectional view illustrating a magnetic sensor according to a second embodiment. FIG. 19 corresponds to FIG. 3. The magnetic sensor in FIG. 19 basically has the same configuration as the magnetic sensor in FIGS. 1 to 3, and the configuration of multilayer body 4 is different from that of the magnetic sensor in FIGS. 1 to 3. That is, in the magnetic sensor in FIG. 19, insulating film 3 is disposed on magnet 2 in multilayer body 4, and magnetic sensor element 1 is disposed on insulating film 3. Side surface 4a of multilayer body 4 is inclined with respect to top surface 4b. As a result, because magnetic sensor element 1 is stacked on magnet 2, outer edge 1a of magnetic sensor element 1 is located inside outer edge 2a of magnet 2 in planar view. From a different point of view, the area of magnet 2 is larger than the area of magnetic sensor element 1.

The magnetic sensor in FIG. 19 can be manufactured by a method basically similar to the method for manufacturing the magnetic sensor in FIGS. 4 to 11. However, in the method for manufacturing the magnetic sensor in FIG. 19, in the processes in FIGS. 5 to 7, magnet 2 is formed on insulating film 10, insulating film 3 is formed on magnet 2, and magnetic sensor element 1 is formed on insulating film 3. Other processes are similar to those in the method for manufacturing the magnetic sensor in FIGS. 4 to 11.

Advantageous Effect

In the magnetic sensor, an effect similar to that of the magnetic sensor in FIG. 18 can be obtained. Furthermore, in the magnetic sensor, outer edge 1a of magnetic sensor element 1 is located inside outer edge 2a of magnet 2 in planar view. In this case, the bias magnetic field by magnet 2 can be applied from the entire outer periphery of magnetic sensor element 1, so that the attenuation of the magnetic flux density of the bias magnetic field can be prevented at the end of magnetic sensor element 1 as compared with the magnetic sensor in FIGS. 1 to 3. For this reason, the uniformity of the bias magnetic field applied from magnet 2 in magnetic sensor element 1 can be improved. As a result, the sensitivity can be improved as compared with the magnetic sensor in FIGS. 1 to 3.

Third Embodiment

Configuration of Magnetic Sensor

Figure 20:
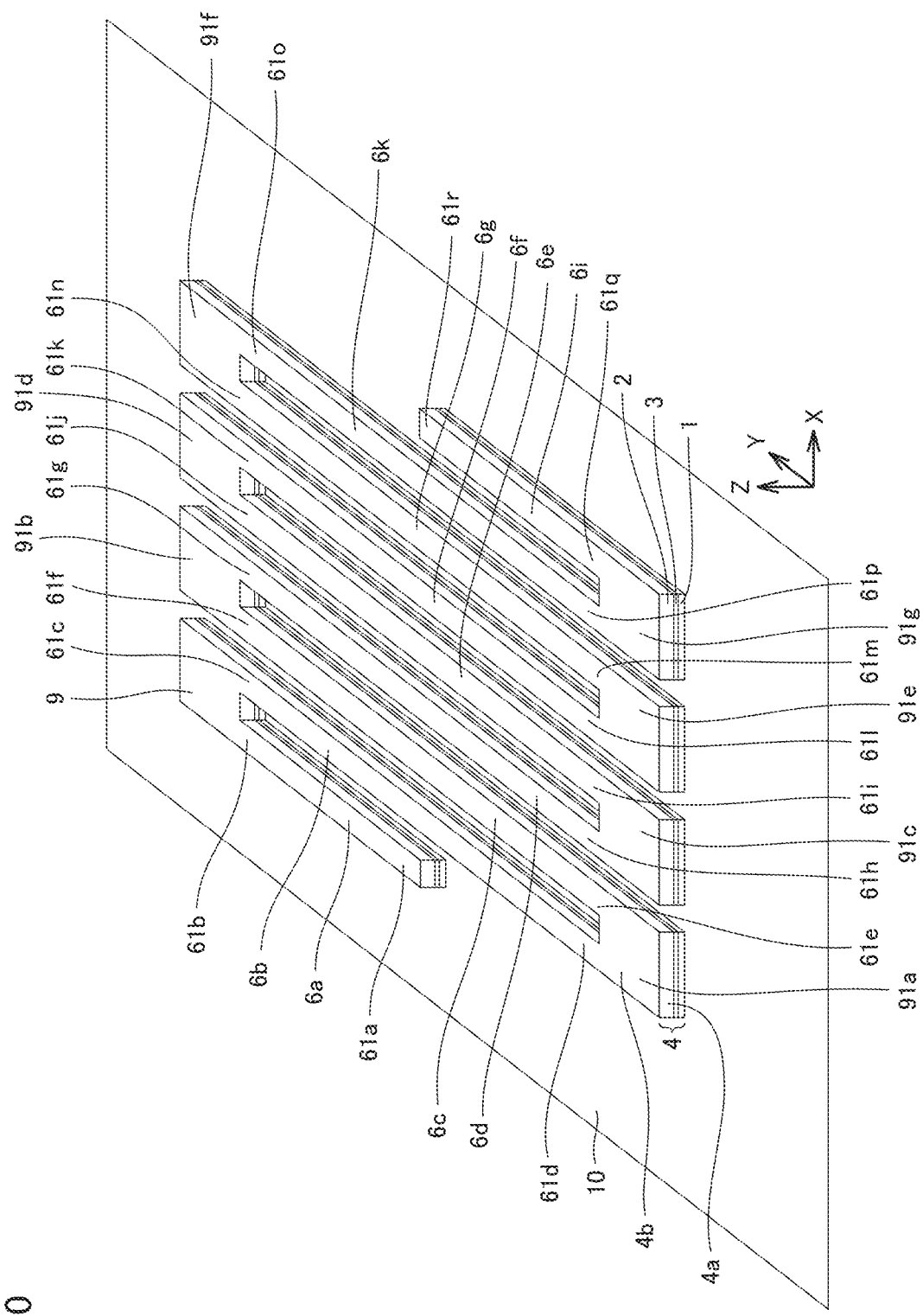
FIG. 20 is a schematic perspective view illustrating a magnetic sensor according to a third embodiment.

FIG. 20 is a schematic perspective view illustrating a magnetic sensor according to a third embodiment. The magnetic sensor in FIG. 20 basically has the same configuration as the magnetic sensor in FIG. 18, but the planar shape thereof is different from that of the magnetic sensor in FIG. 18. That is, in the magnetic sensor in FIG. 20, first sensor portion 6a to ninth sensor portion 6i, which are at least three sensor portions, are arranged in parallel with an interval therebetween. Ends of adjacent sensor sections are connected alternately. The planar shape of the magnetic sensor in FIG. 20 is what is called a meander shape.

First sensor portion 6a includes first end 61a and second end 61b. Second sensor portion 6b is disposed in parallel to first sensor portion 6a with an interval therebetween. Second sensor portion 6b includes third end 61c and fourth end 61d. Third end 61c is disposed so as to face second end 61b. Second end 61b and third end 61c are connected by connection portion 9.

A third sensor portion 6c is disposed in parallel to second sensor portion 6b with an interval therebetween. Third sensor portion 6c includes a fifth end 61e and a sixth end 61f. Fifth end 61e faces fourth end 61d. Fourth end 61d and fifth end 61e are connected by an additional connection portion 91a. A fourth sensor portion 6d is disposed in parallel to third sensor portion 6c with an interval therebetween. Fourth sensor portion 6d includes a seventh end 61g and an eighth end 61h. Seventh end 61g faces sixth end 61f. Sixth end 61f and seventh end 61g are connected by an additional connection portion 91b.

A fifth sensor portion 6e is disposed in parallel to fourth sensor portion 6d with an interval therebetween. Fifth sensor portion 6e includes a ninth end 61i and a tenth end 61j. Ninth end 61i faces eighth end 61h. Eighth end 61h and ninth end 61i are connected by an additional connection portion 91c. A sixth sensor portion 6f is disposed in parallel to fifth sensor portion 6e with an interval therebetween. A sixth sensor portion 6f includes an eleventh end 61k and a twelfth end 61l. Eleventh end 61k faces tenth end 61j. Tenth end 61j and eleventh end 61k are connected by an additional connection portion 91d.

A seventh sensor portion 6g is disposed in parallel to sixth sensor portion 6f with an interval therebetween. Seventh sensor portion 6g includes a thirteenth end 61m and a fourteenth end 61n. Thirteenth end 61m faces twelfth end 61l. Twelfth end 61l and thirteenth end 61m are connected by an additional connection portion 91e. An eighth sensor portion 6h is disposed in parallel to seventh sensor portion 6g with an interval therebetween. Eighth sensor portion 6h includes a fifteenth end 61o and a sixteenth end 61p. Fifteenth end 61o faces fourteenth end 61n. Fourteenth end 61n and fifteenth end 61o are connected by an additional connection portion 91f.

A ninth sensor portion 6i is disposed in parallel to eighth sensor portion 6h with an interval therebetween. Ninth sensor portion 6i includes a seventeenth end 61q and an eighteenth end 61r. Seventeenth end 61q faces sixteenth end 61p. Sixteenth end 61p and fifteenth end 61o are connected by an additional connection portion 91f. As described above, the magnetic sensor in FIG. 20 includes first to ninth sensor portions 6a to 6i, connection portion 9, and additional connection portions 91a to 91g. First to ninth sensor portions 6a to 6i, connection portion 9, and additional connection portions 91a to 91g are constituted by multilayer body 4. Multilayer body 4 includes at least magnetic sensor element 1 and magnet 2. That is, first to ninth sensor portions 6a to 6i, connection portion 9, and additional connection portions 91a to 91g include magnetic sensor element 1 and magnet 2.

In the magnetic sensor described above, side surface 4a of multilayer body 4 may be inclined with respect to top surface 4b similarly to the magnetic sensor in FIGS. 1 to 3. As the magnetic sensor in FIG. 19, magnetic sensor element 1 may be disposed on magnet 2 in multilayer body 4.

Advantageous Effect

The magnetic sensor includes third sensor portion 6c and additional connection portion 91a. Third sensor portion 6c is located on the opposite side of first sensor portion 6a as viewed from second sensor portion 6b. Third sensor portion 6c is disposed spaced at the interval from second sensor portion 6b in the second direction (X-axis direction). Third sensor portion 6c is formed so as to extend along the first direction (Y-axis direction). Third sensor portion 6c includes fifth end 61e and sixth end 61f that are ends in the first direction. Fourth end 61d faces fifth end 61e. Additional connection portion 91a connects fourth end 61d and fifth end 61e. Third sensor portion 6c and additional connection portion 91a are formed of multilayer body 4.

In this case, first sensor portion 6a, second sensor portion 6b, and third sensor portion 6c, which are magnetic sensitive portions, are arranged in parallel at intervals in the second direction. Therefore, the increase in the occupied area of the magnetic sensor can be prevented as compared with the case where first sensor portion 6a, second sensor portion 6b, and third sensor portion 6c are disposed so as to extend in different directions. For example, when the above-described magnetic sensor is manufactured using a semiconductor process, reducing the occupied area of the magnetic sensor enhances the mass production effect of the magnetic sensor, thereby contributing to a reduction in manufacturing cost.

Configuration of Modification of Magnetic Sensor

Figure 21:
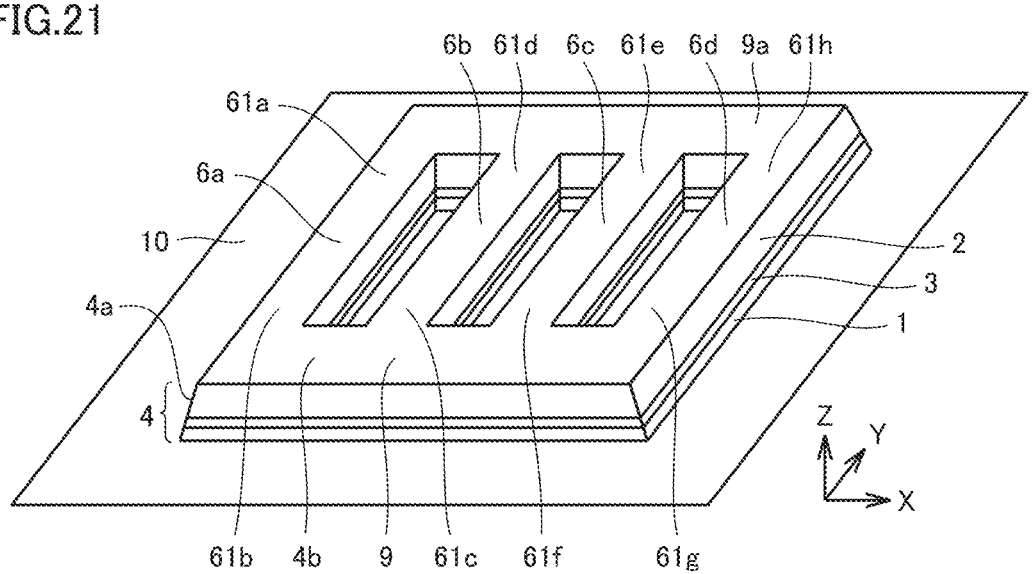
FIG. 21 is a schematic perspective view illustrating a modification of the magnetic sensor of the third embodiment.

FIG. 21 is a schematic perspective view illustrating a modification of the magnetic sensor of the third embodiment. The magnetic sensor in FIG. 21 basically has the same configuration as the magnetic sensor in FIGS. 1 to 3, but has the planar shape different from that of the magnetic sensor in FIGS. 1 to 3. That is, in the magnetic sensor in FIG. 21, first sensor portion 6a to fourth sensor portion 6d, which are at least three sensor portions, are arranged in parallel with an interval therebetween. Ends of adjacent sensor sections are connected. The planar shape of the magnetic sensor in FIG. 21 is what is called a ladder shape.

First sensor portion 6a includes first end 61a and second end 61b. Second sensor portion 6b is disposed in parallel to first sensor portion 6a with an interval therebetween. Second sensor portion 6b includes third end 61c and fourth end 61d. Third end 61c is disposed so as to face second end 61b.

A third sensor portion 6c is disposed in parallel to second sensor portion 6b with an interval therebetween. Third sensor portion 6c includes a fifth end 61e and a sixth end 61f. Fifth end 61e faces fourth end 61d. A fourth sensor portion 6d is disposed in parallel to third sensor portion 6c with an interval therebetween. Fourth sensor portion 6d includes a seventh end 61g and an eighth end 61h. Seventh end 61g faces sixth end 61f. Eighth end 61h faces fifth end 61e. Sixth end 61f and seventh end 61g are connected by an additional connection portion 91b. Second end 61b, third end 61c, sixth end 61f, and seventh end 61g are connected by connection portion 9. First end 61a, fourth end 61d, fifth end 61e, and eighth end 61h are connected by additional connection portion 91a.

Advantageous Effect

The magnetic sensor includes third sensor portion 6c and additional connection portion 91a. Third sensor portion 6c is located on the opposite side of first sensor portion 6a as viewed from second sensor portion 6b. Third sensor portion 6c is disposed spaced at the interval from second sensor portion 6b in the second direction (X-axis direction). Third sensor portion 6c is formed so as to extend along the first direction (Y-axis direction). Third sensor portion 6c includes fifth end 61e and sixth end 61f that are ends in the first direction. Fourth end 61d faces fifth end 61e. Connection portion 9 connects second end 61b, third end 61c, and sixth end 61f. Additional connection portion 91a connects first end 61a, fourth end 61d, and fifth end 61e. Third sensor portion 6c and additional connection portion 91a are formed of multilayer body 4. Also in this case, similarly to the magnetic sensor in FIG. 20, the occupied area of the magnetic sensor can be relatively reduced, and as a result, the manufacturing cost of the magnetic sensor can be reduced.

Fourth Embodiment

Configuration and Advantageous Effect of Magnetic Sensor

Figure 22:
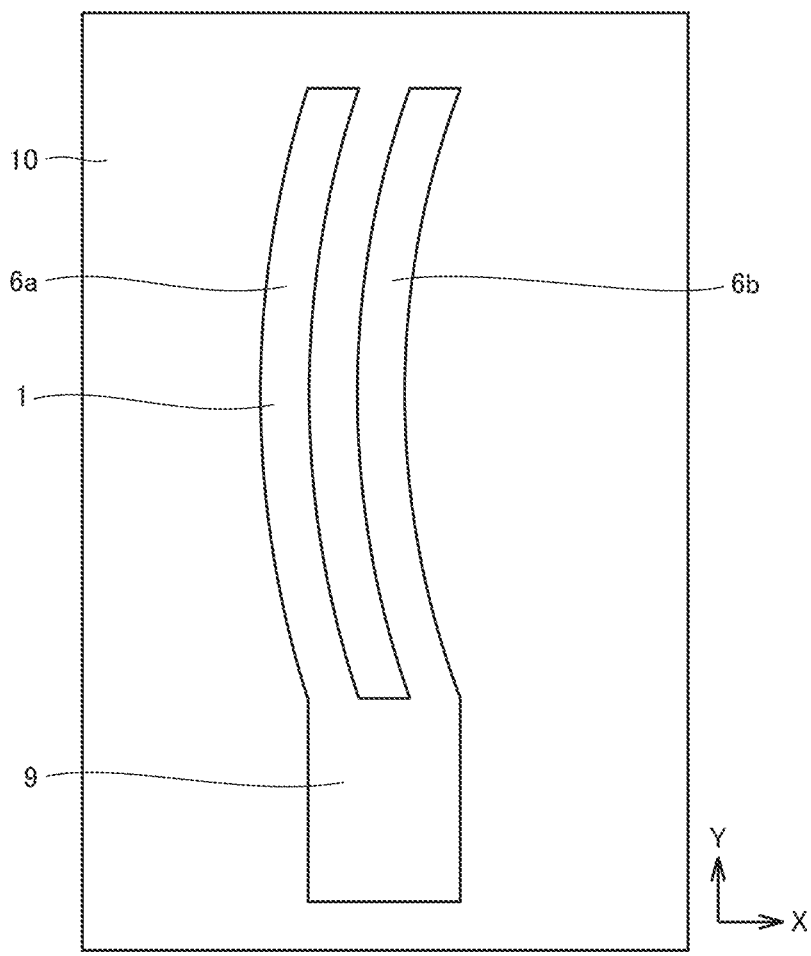
FIG. 22 is a schematic diagram illustrating a planar shape of a magnetic sensor according to a fourth embodiment.

FIG. 22 is a schematic diagram illustrating a planar shape of a magnetic sensor according to a fourth embodiment. FIG. 22 corresponds to FIG. 2. The magnetic sensor in FIG. 22 basically has the same configuration as the magnetic sensor in FIGS. 1 to 3, but has the planar shape different from that of the magnetic sensor in FIGS. 1 to 3. That is, the magnetic sensor in FIG. 22 has a shape in which first sensor portion 6a and second sensor portion 6b are curved with respect to the Y-axis direction. From a different point of view, outer peripheries in the X-axis direction of first sensor portion 6a and second sensor portion 6b in planar view are curved. The planar shape of first sensor portion 6a and the planar shape of second sensor portion 6b are substantially the same, but may be different from each other. Even with the magnetic sensor having such the configuration, the same effects as those of the magnetic sensor in FIGS. 1 to 3 can be obtained.

It should be considered that the disclosed embodiments are an example in all respects and not restrictive. As long as there is no contradiction, at least two of the disclosed embodiments may be combined. The basic scope of the present disclosure is defined by not the above description but the claims, and it is intended that all modifications within the meaning and scope of the claims are included in the present invention.

REFERENCE SIGNS LIST

1: magnetic sensor element, 1a, 2a: outer edge, 2: magnet, 3, 10: insulating film, 4: multilayer body, 4a: side surface, 4b: top surface, 5: substrate, 6a: first sensor portion, 6b: second sensor portion, 6c: third sensor portion, 6d: fourth sensor portion, 6e: fifth sensor portion, 6f: sixth sensor portion, 6g: seventh sensor portion, 6h: eighth sensor portion, 6i: ninth sensor portion, 9: connection portion, 11: magnetic film, 12: nonmagnetic film, 13, 15, 21, 103: arrow, 17, 18, 101, 102: graph, 20: resist pattern, 61a: first end, 61b: second end, 61c: third end, 61d: fourth end, 61e: fifth end, 61f: sixth end, 61g: seventh end, 61h: eighth end, 61i: ninth end, 61j: tenth end, 61k: eleventh end, 61l: twelfth end, 61m: thirteenth end, 61n: fourteenth end, 61o: fifteenth end, 61p: sixteenth end, 61q: seventeenth end, 61r: eighteenth end, 91a, 91b, 91c, 91d, 91e, 91f, 91g: additional connection portion

The invention claimed is:

1. A magnetic sensor comprising:
a first sensor portion to extend in a first direction, the first sensor portion including a first end and a second end that are ends in the first direction;
a second sensor portion to be disposed at an interval from the first sensor portion in a second direction orthogonal to the first direction and formed so as to extend along the first direction, the second sensor portion including a third end and a fourth end that are ends in the first direction, the second end facing the third end; and a connection portion to connect the second end and the third end,
wherein a connection structure formed of the first sensor portion, the second sensor portion, and the connection portion is constituted of a multilayer body that is entirely and integrally made up of, a magnetic sensor element; an insulating film stacked on the magnetic sensor element; and a magnet that is stacked on the insulating film and applies a bias magnetic field to the magnetic sensor element,
the first sensor portion, the second sensor portion, and the connection portion of the magnet are magnetized in the second direction such that respective magnetization directions are aligned with each other, and
a magnetic change in the second direction is detected.

2. The magnetic sensor according to claim 1, wherein an outer edge of the magnetic sensor element is located outside an outer edge of the magnet in planar view.

3. The magnetic sensor according to claim 2, wherein the multilayer body includes a top surface and a side surface continuous with the top surface, and
the side surface is inclined with respect to the top surface.

4. The magnetic sensor according to claim 1, wherein an outer edge of the magnetic sensor element is located inside an outer edge of the magnet in planar view.

5. The magnetic sensor according to claim 1, comprising:
a third sensor portion to be located on a side opposite to the first sensor portion as viewed from the second sensor portion, disposed at an interval from the second sensor portion in the second direction, and formed so as to extend along the first direction, the third sensor portion including a fifth end and a sixth end that are ends in the first direction, the fourth end facing the fifth end; and
an additional connection portion to connect the fourth end and the fifth end, wherein
the third sensor portion and the additional connection portion are constituted of the multilayer body.

6. A method for manufacturing a magnetic sensor, the method comprising:
forming, on a main surface of a substrate having the main surface, a multilayer body that is made up of: a magnetic sensor element an insulating film stacked on the magnetic sensor element; and a magnet that is stacked on the insulating film and applies a bias magnetic field to the magnetic sensor element;
removing partially the multilayer body; and
magnetizing the magnet of the multilayer body such that magnetization directions are aligned,
wherein
the multilayer body processed in the removing partially the multilayer body includes:
a first sensor portion extending in a first direction;
a second sensor portion that is disposed at an interval from the first sensor portion in a second direction orthogonal to the first direction and formed so as to extend along the first direction; and
a connection portion,
the first sensor portion includes a first end and a second end that are ends in the first direction,
the second sensor portion includes a third end and a fourth end that are ends in the first direction,
the second end faces the third end,
the connection portion connects the second end and the third end,
in the removing the multilayer body is processed such that the multilayer body is entirely and integrally made up of the first sensor portion, the second sensor portion, and the connection portion,
in the magnetizing the first sensor portion, the second sensor portion, and the connection portion are magnetized such that respective magnetization directions are the second direction, and
a magnetic change in the second direction is detected.

7. The method for manufacturing a magnetic sensor according to claim 6, wherein in the removing partially the multilayer body, the magnetic sensor element and the magnet in the multilayer body are continuously etched.

\* \* \* \* \*